United States Patent [19]

Suzuki

[11] Patent Number: 5,021,821
[45] Date of Patent: Jun. 4, 1991

[54] FILM CIRCUIT SUBSTRATE EXPOSURE APPARATUS

[75] Inventor: Shigeru Suzuki, Tachikawa, Japan

[73] Assignee: Ushio Denki, Tokyo, Japan

[21] Appl. No.: 469,113

[22] Filed: Jan. 24, 1990

[51] Int. Cl.⁵ .................. G03B 27/32; G03B 27/42; G03B 27/52
[52] U.S. Cl. ..................................... 355/53; 355/26
[58] Field of Search .................. 355/18, 26, 39, 53, 355/55, 58, 63

[56] References Cited

U.S. PATENT DOCUMENTS 3,228,284  1/1966  Kallenberg ........................ 355/63
3,531,198  9/1970  Delp .................................. 355/26
3,998,546  12/1976  Wally, Jr. et al. ................ 355/53

OTHER PUBLICATIONS

"Tape Automated Bonding", Microelectronics Packaging Handbook, 1989, pp. 409–435.

Primary Examiner—Richard A. Wintercorn
Attorney, Agent, or Firm—Armstrong, Nikaido, Marmelstein, Kobovcik & Murray

[57] ABSTRACT

A film circuit substrate exposure apparatus is disclosed, in which members movable along an optical axis such as a reticle support, a projection lens and a film pressing member are mounted on a common linear movement guide by using a linear movement driver, for instance a cross roller guide, in a predetermined spaced-apart relation to one another to set the optical axis and without inclination with respect to the optical axis. The apparatus thus pronounced practical merits such as freedom from rattling, capability of ready positioning and focusing operations, less partial out of focus or aberration of obtainable patterns, and particularly elimination of complicated operations in double side exposure.

4 Claims, 3 Drawing Sheets

FILM CIRCUIT SUBSTRATE EXPOSURE APPARATUS

BACKGROUND OF THE INVENTION

1. Field of the Invention

This invention relates to a film circuit substrate exposure apparatus mainly used for the manufacture of flexible printed circuits.

2. Description of the Prior Art

A flexible printed circuit(hereinafter referred to as FPC) which is used for the assembly of film carrier type semiconductor devices, liquid crystal boards, cameras and table calculators usually consists of a polyester film or polyimide film having a thickness of 25 to 125 microns as substrate material.

Such film for FPC, which photoresist is coated on, is exposed to light by an exposure apparatus and then etched for mounting of IC and other circuit elements by means of bonding. Therefore, although the FPC is a "printed" circuit, it requires as high accuracy as comparable to that for "Integrated Circuit".

FIG. 3 is a view for explaining a prior art exposure apparatus and method of use of the same apparatus. Referring to the Figure, reference numeral 1 designates exposure light source including a short arc discharge lamp and a mirror, 2 illumination lens system including an integrator lens, and 3 reticle, which is supported on reticle support 5 movable in a horizontal plane in two directions X and Y by x-y driver 4 and 6 circumferential reticle driver. These drivers are mounted together with reticle support 5 on image projection cylinder 7. Image projection cylinder 7 is secured to stand 25 via holder 9. Reference numeral 8 designates screw member for moving image projection cylinder 7 in vertical direction Z. Screw member 8 has a female thread corresponding to a male thread formed in cylinder 7. Reference numeral 16 designates projection lens supported in projection lens holder 12. Reference numeral 15 designates screw member for moving projection lens holder 12 in vertical direction Z. Member 15 has a female thread corresponding to a male thread formed in cylinder 7. Reference numerals 10 and 11 designate engagement mechanisms consisting of keys and key grooves for restricting cylinder 7 and holder 12 to movement in vertical direction Z. Reference numeral 13 designates illumination lens system holder.

Reference numeral 17 designates FPC film with perforations 17'. Film 17 is fed to predetermined extent by a pair of predetermined extent feed rollers 18. Reference numeral 19 designates film receiver, which put down film 17 when it is pressed up by pressing member 21 with positioning pins 20. Film receiver 19 has pin escapement grooves 19' for pins 20. Film pressing member 21 has two rows of pins, only one of which is shown. Reference numeral 14 designates linear driver for driving film pressing member 21, 22 driver guide member, and 23 drive section.

With this exposure apparatus, a pattern of reticle 3 is projected onto FPC film 17. To this end, the position of the reticle is adjusted with X-Y driver 4 and circumferential reticle driver 6 such as to permit projection with reference to perforations of film 17. In addition, for providing normal focusing and magnification projection cylinder 7 and projection lens holder 12 are adjusted by turning screw members 8 and 15. In this adjustment, members 7 and 12 are only displaced in the Z direction.

Meanwhile, film 17 is paid off a supply reel(not shown), and when it reaches an illumination zone, it is fed by predetermined extent by predetermined extent feed rollers 18 which are driven by a stepping motor(not shown) or the like. At this time, film 17 is accurately positioned by pins 20 inserted through its perforations 17'. At this time, the restraint of film 17 by predetermined extent feed rollers 18 is released, and film 17 is exposed in a state held between and in close contact with film receiver 19 and pressing member 21. The film is thus exposed in a state between and in close contact with film receiver 19 and pressing member 21. For claiming the film between and in close contact with members 19 and 21, liner driver 14 is displaced in the Z direction(i.e., optical axis direction) by drive section 23 while it is in rattling-free engagement in guide 22, and pins 20 of film pressing member 21 are received with play in escapement grooves 19'.

After exposure, film 17 is further fed by predetermined extent feed to be taken up on a take-up reel(not shown).

With the prior art exposure apparatus as described above, the image projection system and film positioning system constitute respective independent units. Therefore, accurate setting of the two systems relative to each other requires complicated adjustments and takes a considerable time. Besides, very high accuracy of the positional relation can not be expected. Further, since the individual units are assemblies of many components, it is difficult to meet sufficient dimensional and geometrical accuracy inclusive of engagement accuracy. This means that it is difficult to obtain projection of the reticle pattern on the FPC film at accurate position thereof with reference to perforations of the film. In addition, optically partial out of focus in one side of the image and aberrations are liable. Therefore, it is difficult to obtain accurate pattern of exposure.

SUMMARY OF THE INVENTION

The present invention has been intended in order to overcome the above drawbacks in the prior art, and its object is to provide a novel FPC film circuit substrate exposure apparatus, which is comparatively simple in construction, permits increasing the optical accuracy and permits stable setting of an accurate exposure position.

To attain the above object of the invention, a reticle support, a projection lens and a film pressing member for positioning film, these members being most importantly concerned with adjustment of positional relation and positioning, are supported by a common linear movement guide. These members are mounted such that their centers are accurately held at predetermined distances from the common linear movement guide using simple components, and also the accuracy of the parallelism of their axes to the common linear movement guide is improved.

As a further improved structure, a light source system is also mounted on the common linear movement guide so that all these components are operable along the optical axis with the common linear movement guide as a basis.

With this arrangement, the positions of the components are determined, in design and manufacture, with their distances from the linear movement guide as a basis, and the geometrical accuracy is further improved.

Thus, the optical axis matching of individual components relative to one another is simplified, and also there is no need of complicated optical axis matching and position control of the individual components with respect to one another. It is thus possible to permit a reticle pattern to be projected comparatively easily on a FPC film at an accurate position thereof, with accurate magnification and with less partial out of focus or aberrations.

DESCRIPTION OF THE PREFERRED EMBODIMENT

Figure 1:
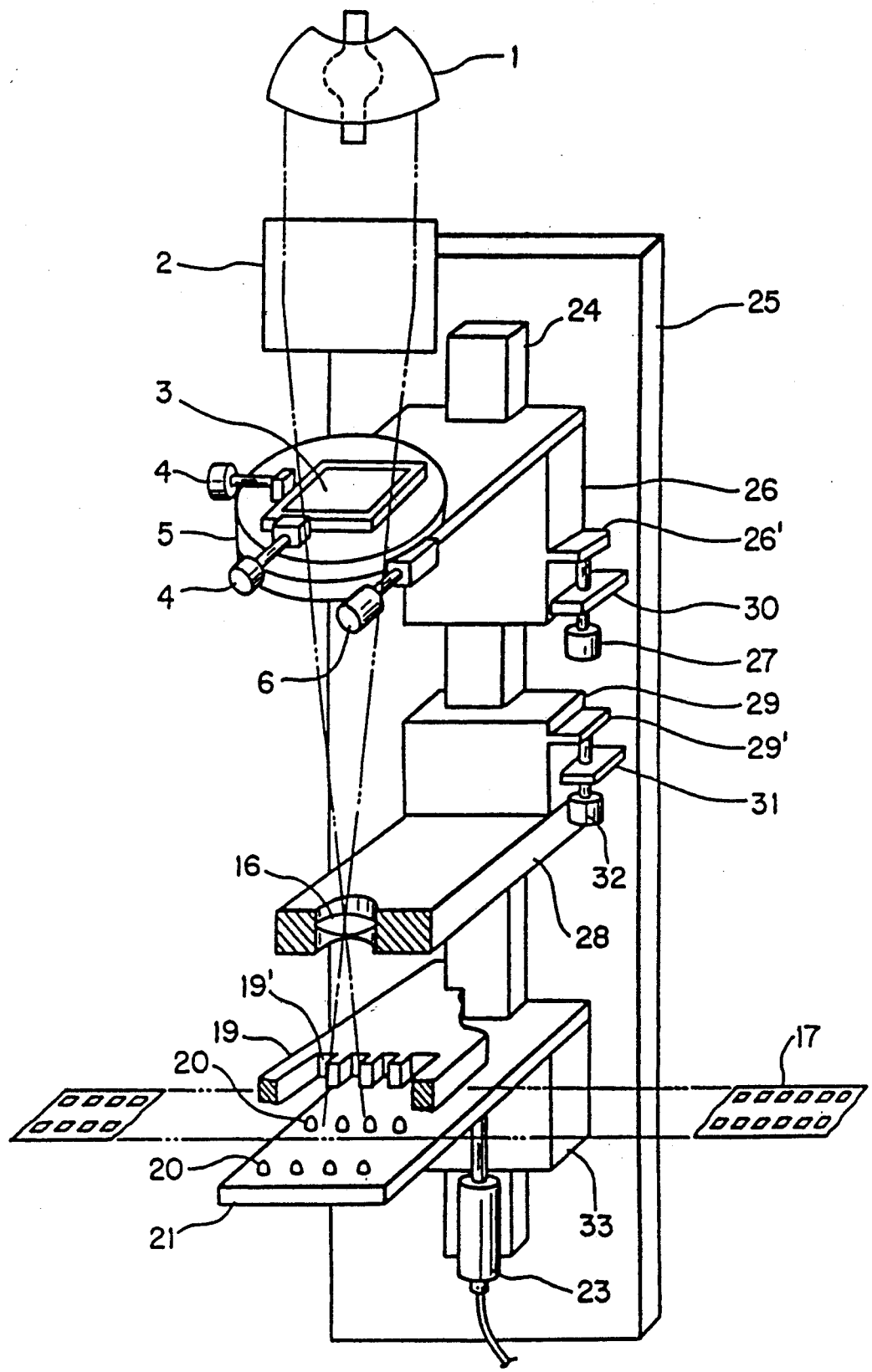
FIG. 1 is a view showing an embodiment of the film circuit substrate exposure apparatus according to the invention.

FIG. 1 shows an embodiment of the film circuit substrate exposure apparatus according to the invention, particularly an essential part of the embodiment, with omission of supply and take-up reels and predetermined extent feed rollers.

Referring to the Figure, reference numeral 24 designates a common linear movement guide secured to stand 25. On guide 24 is mounted linear movement support 26 for linearly moving reticle support 5. Micrometer support 30 with micrometer head 27 is mounted on stand 25. Micrometer head 27 is operable to cause displacement of linear movement support 26 in vertical direction(i.e., optical axis direction) by pressing up or putting down projection 26' of support 26. Other linear movement support 29 is mounted on guide 24 for linearly moving projection lens holder 28 or like member holding projection lens 16. Micrometer support 31 with micrometer head 32 is mounted on stand 25. Micrometer head 32 is operable to cause displacement of linear movement support 29 in vertical direction(i.e., optical axis direction) by pressing up or putting down projection 29' of support 29. The axis of rotation of the reticle support and lens axis are set to be parallel to and at predetermined distances(optical axis) form guide 24.

Further, film receiver 19 holding down film 17 is secured to stand 25 such that its surface holding down film 17 in close contact is perpendicular to guide 24. Film pressing member 21 for positioning film 17 is mounted on guide 24 via linear movement support 33 such that its surface to be close contact with film 17 is perpendicular to guide 24. It is desirable to provide vaccum-chuck holes on that surface of member 21, and vaccum-chuck film 17 while exposure. Two rows of positioning pins 20 are set such that the center line between these two rows is at a predetermined distance from the common linear movement guide.

It is to be appreciated that only the components noted above, which are small in number, may be machined and mounted such that the optical axis is determined on basis of guide 24. For the linear movement or linear movement support, a well-known guide by "rolling" such as a cross roller guide may be used with preliminary pressure applied to the roller or the like to prevent rattling.

Figure 2:
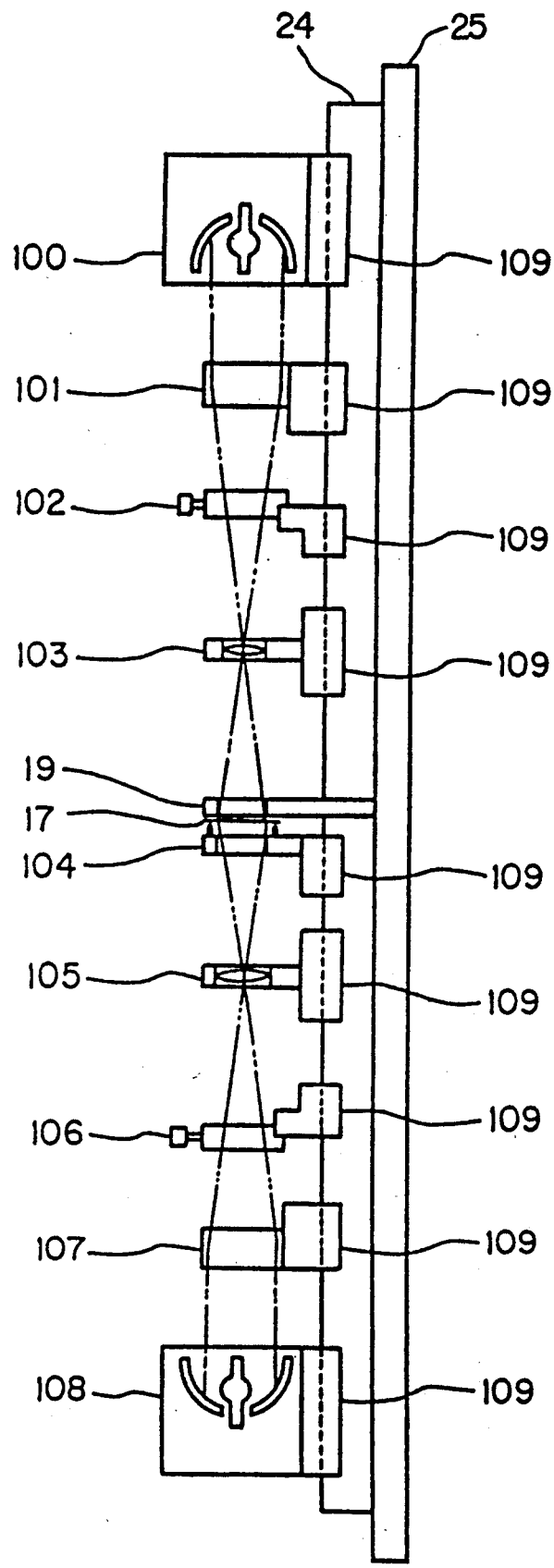
FIG. 2 is a view showing a different embodiment of the invention.
Figure 3:
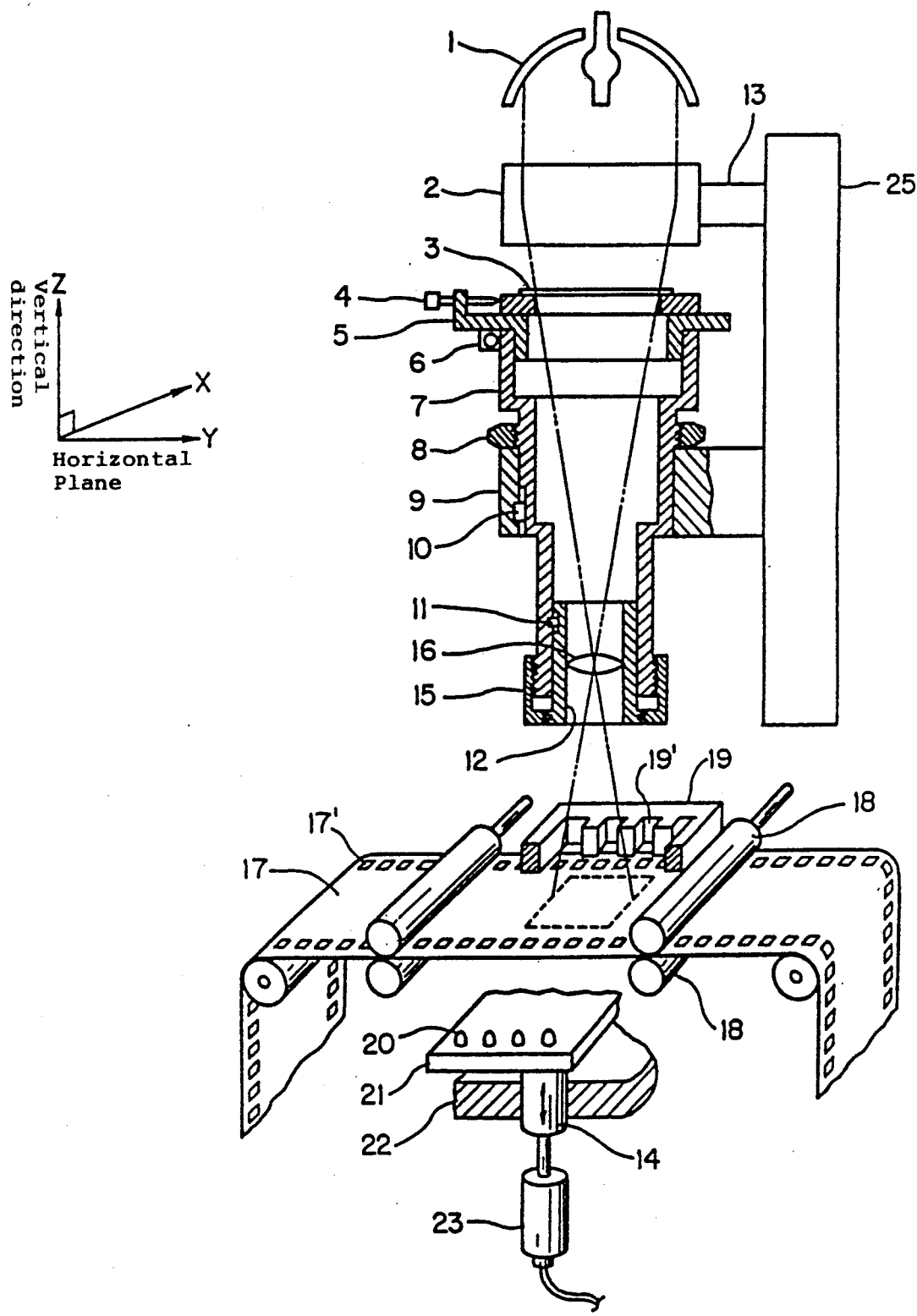
FIG. 3 is a view showing a prior art film circuit substrate exposure apparatus.

FIG. 2 is a schematic view showing a different embodiment of the invention.

While the embodiment shown in FIG. 1 has been a "single side exposure" apparatus, this embodiment of FIG. 2 is a film exposure apparatus which is capable of "double side exposure", i.e., "simultaneous double side exposure". On common linear movement guide 24 are each mounted first light source system 100, first projection lens system 101, first reticle support 102, first positioning lens 103, film pressing member 104 for positioning film, second projection lens 105, second reticle support 106, second projection lens system 107 and second light source system 108, these components being mounted in the mentioned order for relative movement. Reference numeral 109 designates linear movement support.

In the double side exposure, apparatus unlike the single side exposure apparatus, it is necessary to align two axes of each optical components which expose front and back surface of film. In the prior art apparatus and method, the optical axis alignment are further difficult. In the embodiment shown in FIG. 2, these alignment can be easily performed, and also the accuracy thereof is increased.

If light source system 100 and projection lens system 101 are constituted by a single light source unit, such light source unit may be supported on the common linear movement guide by a linear movement support.

What is claimed:

1. A film circuit substrate exposure apparatus, in which a reticle support, a projection lens and a pressing member for positioning film are mounted in the mentioned order for relative movement on a common linear movement guide.

2. A film circuit substrate exposure apparatus, in which a light source system, a reticle support, a projection lens and a pressing member for positioning film are mounted in the mentioned order for relative movement on a common linear movement guide.

3. A film circuit substrate exposure apparatus, in which a first reticle support, a first projection lens, a pressing member for positioning film, a second projection lens, a second reticle lens, and a second reticle support are each mounted in the mentioned order for relative movement on a common linear movement guide.

4. A film circuit substrate exposure apparatus, in which a first light source system, a first reticle support, first projection lens, a pressing member for positioning film, a second projection lens, a second reticle support, and a second light source system are each mounted in the mentioned order for relative movement on a common linear movement guide.

* * * * *